(12) United States Patent
Yang et al.

(10) Patent No.: US 10,228,504 B2
(45) Date of Patent: Mar. 12, 2019

(54) ILLUMINATING DEVICE

(71) Applicant: LG INNOTEK CO., LTD., Seoul (KR)

(72) Inventors: Hyun Duck Yang, Seoul (KR); Jin Hee Kim, Seoul (KR); Chul Hong Kim, Seoul (KR); Gwang Ho Park, Seoul (KR); Moo Ryoung Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 91 days.

(21) Appl. No.: 15/363,789

(22) Filed: Nov. 29, 2016

(65) Prior Publication Data

US 2017/0075054 A1  Mar. 16, 2017

Related U.S. Application Data

(63) Continuation of application No. 14/587,774, filed on Dec. 31, 2014, now Pat. No. 9,541,696, which is a
(Continued)

(30) Foreign Application Priority Data

Aug. 10, 2012  (KR) .................. 10-2012-0087769

(51) Int. Cl.
 *F21V 8/00* (2006.01)
 *F21V 13/12* (2006.01)
(Continued)

(52) U.S. Cl.
 CPC .......... *G02B 6/0036* (2013.01); *F21S 43/14* (2018.01); *F21S 43/145* (2018.01); *F21S 43/239* (2018.01);
(Continued)

(58) Field of Classification Search
 CPC .... G02B 6/0036; G02B 6/0083; G02B 6/003; G02B 6/0031; G02B 6/0025;
(Continued)

(56) References Cited

U.S. PATENT DOCUMENTS 1,413,096 A    4/1922  Cain
8,960,977 B2   2/2015  Yang et al.
(Continued)

FOREIGN PATENT DOCUMENTS

CN  103574350 A   2/2014
EP    2690356 A2  1/2014
(Continued)

OTHER PUBLICATIONS

Office Action dated Jul. 4, 2016 in Chinese Application No. 201310347198.6.
(Continued)

*Primary Examiner* — David V Bruce
(74) *Attorney, Agent, or Firm* — Saliwanchik, Lloyd & Eisenschenk

(57) ABSTRACT

Disclosed is a lighting device which comprises: an optical member comprising a protruding optical pattern forming a gap with an adjacent layer; at least one light emitting unit inserted into the optical member; and a resin layer formed on the optical member and the at least one light emitting unit, whereby it is possible to obtain an effect that the shapes of light change depending on the viewing angle when viewing the light source by producing various protruding optical patterns, an effect that the whole thickness can be reduced, and an effect that the degree of design freedom can be enhanced when designing products thanks to an enhanced flexibility.

18 Claims, 3 Drawing Sheets

Related U.S. Application Data continuation of application No. 13/686,675, filed on Nov. 27, 2012, now Pat. No. 8,960,977.

(51) Int. Cl.

| | | |
|---|---|---|
| *H05K 1/02* | (2006.01) | |
| *H05K 1/00* | (2006.01) | |
| *H05K 1/03* | (2006.01) | |
| *F21S 43/14* | (2018.01) | |
| *F21S 43/145* | (2018.01) | |
| *F21S 43/20* | (2018.01) | |
| *F21S 43/239* | (2018.01) | |
| *F21S 43/245* | (2018.01) | |
| *F21S 43/249* | (2018.01) | |
| *F21S 43/40* | (2018.01) | |
| *H05K 1/18* | (2006.01) | |
| *F21Y 101/00* | (2016.01) | |
| *F21Y 105/10* | (2016.01) | |
| *F21Y 115/10* | (2016.01) | |

(52) U.S. Cl.
CPC ........... *F21S 43/245* (2018.01); *F21S 43/249* (2018.01); *F21S 43/26* (2018.01); *F21S 43/40* (2018.01); *F21V 13/12* (2013.01); *G02B 6/0001* (2013.01); *G02B 6/003* (2013.01); *G02B 6/0025* (2013.01); *G02B 6/0031* (2013.01); *G02B 6/0073* (2013.01); *G02B 6/0083* (2013.01); *H05K 1/00* (2013.01); *H05K 1/0274* (2013.01); *H05K 1/0393* (2013.01); *F21Y 2101/00* (2013.01); *F21Y 2105/10* (2016.08); *F21Y 2115/10* (2016.08); *G02B 6/0021* (2013.01); *G02B 6/0068* (2013.01); *H05K 1/189* (2013.01); *H05K 2201/05* (2013.01); *H05K 2201/10106* (2013.01); *H05K 2201/2054* (2013.01)

(58) Field of Classification Search
CPC .. G02B 6/0073; G02B 6/0001; G02B 6/0068; G02B 6/0021; F21S 43/40; F21S 43/245; F21S 43/239; F21S 43/26; F21S 43/145; F21S 43/14; F21S 43/249; H05K 1/0393; H05K 1/00; H05K 1/0274; H05K 1/189; F21V 13/12

See application file for complete search history.

(56) References Cited

U.S. PATENT DOCUMENTS

| | | |
|---|---|---|
| 9,207,393 B2 | 12/2015 | Yang et al. |
| 2005/0207164 A1 | 9/2005 | Holtz et al. |
| 2007/0182885 A1 | 8/2007 | Egi et al. |
| 2007/0279932 A1 | 12/2007 | Ishihara et al. |
| 2009/0016068 A1 | 1/2009 | Chang |
| 2010/0259470 A1 | 10/2010 | Kohtoku et al. |
| 2011/0051411 A1* | 3/2011 | Kim ................. G02F 1/133603 362/235 |
| 2011/0132900 A1 | 6/2011 | Kinoshita et al. |
| 2013/0328090 A1 | 12/2013 | Park et al. |
| 2013/0335975 A1 | 12/2013 | Park et al. |
| 2014/0029239 A1 | 1/2014 | Oh |
| 2014/0029263 A1 | 1/2014 | Park et al. |
| 2014/0043817 A1 | 2/2014 | Zhang et al. |
| 2014/0043819 A1 | 2/2014 | Yang et al. |
| 2014/0043854 A1 | 2/2014 | Yang et al. |
| 2015/0109817 A1 | 4/2015 | Yang et al. |
| 2015/0316699 A1 | 11/2015 | Shimizu |
| 2016/0076730 A1 | 3/2016 | Yang et al. |

FOREIGN PATENT DOCUMENTS

| | | |
|---|---|---|
| JP | 2001-091938 A | 4/2001 |
| JP | 2002-133930 A | 5/2002 |
| JP | 2009-116014 A | 5/2009 |
| JP | 2009-193955 A | 8/2009 |
| KR | 10-2007-0068885 A | 7/2007 |
| KR | 10-2012-0003273 A | 1/2012 |
| KR | 10-2012-0004222 A | 1/2012 |
| KR | 10-2012-0009209 A | 2/2012 |
| WO | WO-2008-099542 A1 | 8/2008 |
| WO | WO 2009/110145 A1 | 9/2009 |
| WO | WO 2012/086896 A1 | 6/2012 |

OTHER PUBLICATIONS

European Search Report dated Oct. 23, 2014 in European Application No. 13179918.1.

Japanese Office Action dated Nov. 28, 2017 in Japanese Application No. 2013-165045.

Office Action dated Jul. 11, 2017 in Japanese Application No. 2013-165045.

\* cited by examiner

ILLUMINATING DEVICE

CROSS-REFERENCE TO RELATED APPLICATIONS

This application is a continuation of Ser. No. 14/587,774, filed Dec. 31, 2014, which is a continuation of U.S. application Ser. No. 13/686,675, filed Nov. 27, 2012, now U.S. Pat. No. 8,960,977, issued on Feb. 24, 2015, which claims the benefit under 35 U.S.C. § 119 of Korean Patent Application No. 10-2012-0087769, filed on Aug. 10, 2012, all of which are herein incorporated by reference in their entirety.

BACKGROUND OF THE INVENTION

Field of the Invention

Embodiments of the present invention relate to a lighting device, and in particular to a lighting device structure which makes it possible to make the whole thickness thinner as such to obtain a high illuminating efficiency in such a way to remove a light guide plate and makes it possible to obtain an effect that the shape and a 3D effect of light change by forming a protrusion optical pattern.

Description of Related Art

The LED (Light Emitting Diode) device is directed to converting an electric signal into infrared ray or light using the natures of a compound semiconductor. Different from a fluorescent lamp, it does not use any harmful substances such as mercury, which results in less environment contamination, along with an advantage that service life is longer as compared to a conventional light source. It also consumes low electric power as compared to a conventional light source, and visibility is good thanks to a high color temperature and no glaring.

The lighting device is currently changing from a type that a conventional incandescent lamp and a conventional fluorescent lamp are used as a light source to a type that a LED device is used as a light source. In particular, there is provided a lighting device which performs a plane light emitting function by using a light guide plate as disclosed in the Korean patent publication number 10-2012-0009209.

The light guide plate is used as a necessary element of the conventional lighting device 1; however it has a limit in making a thinner product owing to the thickness itself of the light guide plate. Since the material of the light guide plate is not flexible, it cannot be applied to the external housing 50, etc. which has curved surfaces, so the product design and the design changes are not easy.

SUMMARY OF THE INVENTION

Accordingly, embodiments of the present invention are made to resolve the problems encountered in the conventional art. It is an object of the embodiment of the present invention to provide a lighting device which makes it possible to make the whole thickness thinner.

It is another object of the embodiment of the present invention to provide a lighting device which provides a high degree of freedom when designing a product by allowing a lighting device itself to have flexibility at an upper portion of a PCB or a lower upper of a second optical member for thereby enhancing the reliability of a product.

It is further another object of the embodiment of the present invention to provide a lighting device which provides a geometric optical pattern.

To achieve the above objects, there is provided a lighting device comprising: an optical member comprising a protrusion optical pattern forming a gap with an adjacent layer; at least one light emitting unit inserted into the optical member; and a resin layer formed on the optical member and the at least one light guiding unit.

Effects of the Invention

The embodiment of the present invention provides an effect that the number of light emitting units is reduced, and the whole thickness of a lighting device can be made thinner by removing a light guide plate and guiding light using a resin layer.

In the embodiment of the present invention, the lighting device is formed using a flexible PCB and a resin layer so as to obtain flexibility, thus enhancing a degree of freedom in a product design.

An optical member with a protrusion optical pattern formed between a resin layer and a reflection member is provided, so an effect that the shape and a 3D feeling of light change depending on a viewing angle. An effect that the shape of a protrusion optical pattern changes can be obtained by forming an adhering pattern between the optical member and the reflection member. In addition, the lighting device with an enhanced aesthetic feeling can be provided, and can be also applied to various fields.

In addition, since the embodiment of the present invention provides a reflection member and a reflection pattern which define a structure configured to efficiently reflect the light emitted from the light emitting units, thereby maximizing luminance along with the enhanced reflectivity of light and providing the uniform plane light source.

A first optical substrate and a second optical substrate each having an optical pattern are provided in the embodiment of the present invention. An air gap is formed at the adhering layer, thus removing the generations of hot spots and a blackening phenomenon which occur at light shield pattern portions, and the reliability of the elements adhered to the adhering layer can be enhanced, and the lighting device with no significant differences in optical characteristics can be manufactured, and a precise alignment between elements can be obtained.

DESCRIPTION OF SPECIFIC EMBODIMENTS

Figure 1:
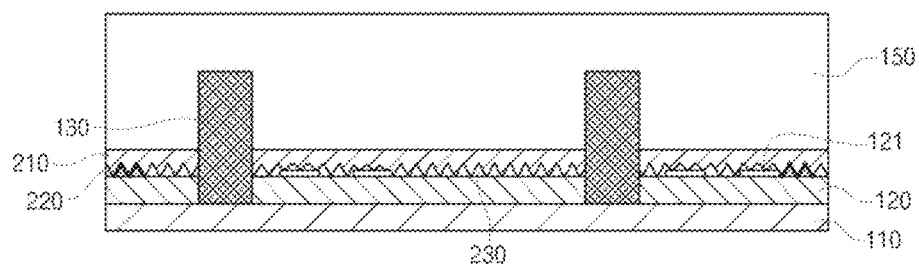
FIG. 1 is a view illustrating major portions of a lighting device according to an embodiment of the present invention.

The embodiments of the present invention that an ordinary person skilled in the art can implement will be described with reference to the accompanying drawings. The embodiments in the specification and the constructions shown in the drawings are provided as a preferred embodiment of the present invention, and it should be understood that there may be various equivalents and modifications which could substitute at the time of filing. In addition, when it comes to the operation principle of the preferred embodiments of the present invention, when the known functions or functions are seemed to make unclear the subject matters of the present invention, they will be omitted from the descriptions of the invention. The terms below are defined in consideration of the functions of the present invention, and the meaning of each term should be interpreted by judging the whole parts of the present specification, and the elements having the similar functions and operations of the drawings are given the same reference numerals.

The present invention is basically directed to a lighting device using a LED as a light source, which features in that a light guide plate is removed, and a resin layer is formed instead, and an optical member with a protrusion optical pattern between a reflection member and a resin layer is further provided, which makes it possible to be applied to various applications thanks to a geometric shape, not a simple plane surface light emission.

The lighting device according to the embodiments of the present invention can be applied to various lamp devices which necessitate lighting for example a lamp for a vehicle, a lighting device at home and a lighting device for the purpose of industry. When it is applied to the lamp for a vehicle, its application includes a headlight, an indoor lighting in a vehicle, a door scuff, a rear lighting, etc. The lighting device according to the embodiments of the present invention can be applied to a backlight unit field which is generally applied to a liquid crystal display. The present invention may be applied to all the lighting-related applications which have been already developed and then commercialized or which would be implemented as the technology advances.

Figure 3:
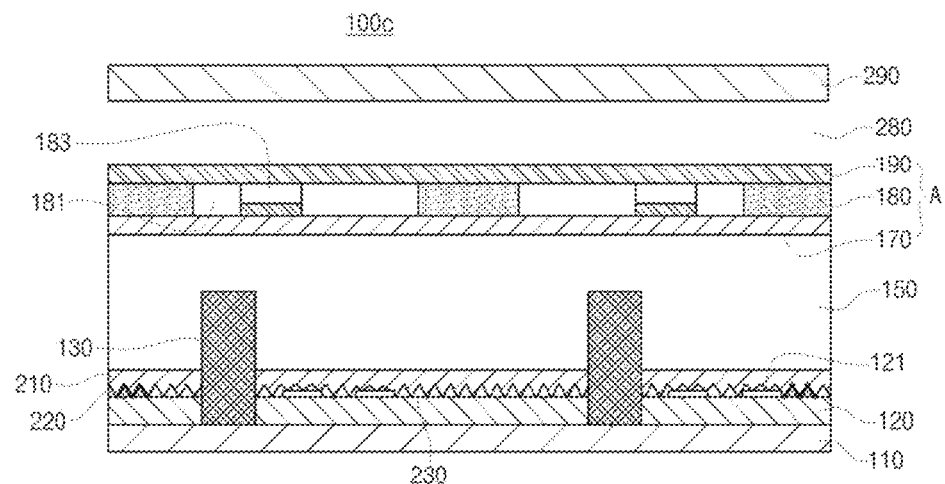
FIG. 3 is a view illustrating a structure in which an optical member and an optical sheet are added to the lighting device according to the embodiment of the present invention illustrated in FIG. 1.

FIG. 3 is a view illustrating the major portions of a lighting device according to an embodiment of the present invention.

Referring to FIG. 3, a lighting device 100a according to the present embodiment of the invention may comprise an optical member 210 with an optical pattern, and at one light emitting unit 130 inserted into the optical member 210. That is, the optical member 210 and the light emitting units 130 may form an arrangement structure in which the light emitting units pass through the optical member 210. Moreover, the lighting device may further comprise a resin layer 150 formed on the optical member 210 and the at least one light emitting unit 130.

Reviewing the configuration of the lighting device according to the present embodiment of the invention, which is embodied based on the basic elements, with reference to FIG. 3, the lighting device according to the present embodiment of the invention may further comprise a printed circuit board 110 on which the light emitting units are mounted.

Specifically, the lighting device according to the present embodiment of the invention may be configured such that the least one light emitting unit 130, and an optical member 210, which is formed in a structure in which the light emitting units are inserted, are sequentially formed, and may comprises a resin layer that buries the light emitting unit 130 and guides the emitting light in a forward direction.

In the above explained structure, there may be further provided a reflection member 120. The optical member 210 may comprise a means which performs an optical operation, for example, a light guide, a lens, a wave guide and the like. FIG. 1 illustrates that the optical member 210 according to one embodiment has a laminated structure composed of two or more layers without being limited to this.

The PCB 110 is a typical substrate formed as a circuit pattern is printed on a substrate. In the present invention, The PCB 110 may be formed of a flexible PCB (FPCB) so as to obtain flexibility.

The light emitting unit 130 is directed to emitting light as it is aligned in one or more numbers on the FPCB 110. The light emitting unit 130 of the present embodiment may be formed of a side view type light emitting diode. When the side view type light emitting diode is used, light transmitted in an upward direction is transmitted though the resin layer, so that brightness can be more easily adjusted compared to a case in which a top view type light emitting diode is used. Furthermore, it is advantageous that a thickness of the resin layer laminated in a structure in which the light emitting unit 130 is buried can be made thinner, and the uniformity of light in light emitting surface of a plate-like structure can be obtained thanks to the resin. That is, when the top view type light emitting diode is used, the light has an upward direction, and in this case, a range in which the light spreads out around the light emitting diode is narrow. On the contrary, in the case of the side view type light emitting diode, the light spreads out widely to a side so that a light distribution property and a property for securing the intensity of light can be improved, thereby allowing the number of light sources to reduce. That is the light emitting diode with the structure in which the light is emitted toward the side, not move straight upwardly can be used as the light emitting unit 130 according to the present embodiment.

Moreover, the light emitting unit according to the present embodiment of the invention may be implemented in a structure which is buried in the resin layer. Also, when the light emitting unit is formed in the structure which is buried in the resin layer, the resin layer and the light emitting unit are integrally formed, so that the structure is simplified. Furthermore, in a case where the light emitting device such as the LED is used as the light emitting unit, a refractive index of a fluorescent silicon substance and the resin layer disposed at the front of the LED light device varies. That is, the intensity of light emitted from the LED is increased by a difference in refractive index compared to the case in which the light is directly emitted to the air.

Specifically, considering the matter that the refractive index of the fluorescent silicon substance is generally 1.5 and the refractive index of the resin layer is 1.47, as a difference in refractive index of a medium which light passes through reduces, a critical angle increases. As a result, light loss generated inside the LED can reduce and the large intensity of light can be secured.

Also, when the light emitting unit is formed in the structure into which the resin layer is inserted, a thickness of the whole lighting device can be made thinner relatively compared to the conventional structure in which a light guide plate is arranged on an upper surface, and since the light emitting unit has a structure in which light is directly emitted into the optical member, it is advantageous that the loss amount of light can be reduced, and thus the efficiency of light can be increased.

In the lighting device 100a according to the present embodiment of the invention, the light emitting unit 130 composed of the side view type light emitting diode is disposed in a direct type, and the number of the whole light emitting units can be reduced by diffusing and guiding the light in an upward direction by utilizing the resin layer, and the total weight and thickness of the lighting device can be significantly reduced.

The resin layer 150 is formed on the upper portions of the optical member 210 and the light emitting unit 130, and the resin layer 150 serves to guide the light from the light emitting unit 130 to diffuse forward. In other words, the resin layer 150 is configured to bury the light emitting unit 130, thereby spreading the light emitted from the light emitting unit 130 in a lateral direction.

The resin layer 150 according to the present embodiment may be made from a resin material which can diffuse light. For example, the resin layer 150 according to the present embodiment is made from an ultraviolet curable resin containing oligomer. More specifically, the resin layer 150 is made from a resin containing urethane acrylate oligomer as a main material. A resin mixed with urethane acrylate oligomer and polyacryl polymer type may be used. Of course, a monomer mixed with IBOA (isobornyl acrylate), HPA (hydroxylpropyl acrylate), 2-HEA (2-hydroxyethyl acrylate), etc. which are low boiling point dilution type reaction monomers may be further contained. As an additive, photoinitiator (1-hydroxycyclohexyl phenyl-ketone, etc.) or antioxidant may be mixed. The above mentioned examples are provided only for illustrative purposes. In addition thereto, a resin layer 150 of the present invention could be formed using a certain resin which is currently under developments and used or all kinds of resins having light diffusion functions which will be developed in the future as the technology advances.

According to the present embodiment of the invention, thanks to the presence of the resin layer 150, it is possible to significantly reduce the thickness which used to occupy a lot of areas in the conventional light guide plate, and the product can be made thinner and compact. The material is flexible, so it can be easily applied to curved surfaces. A degree of freedom in term of the designs of products can be enhanced, and the lighting device according to the present embodiment of the invention can be well applied to flexible displays.

The reflection member 120 is formed on the upper surface of the printed circuit board 110, and has the structure into which the light emitting unit 130 is inserted. Since the reflection member 120 according to the present embodiment is made from a material with a high reflection efficiency, the reflection member serves to reduce light loss by reflecting the light emitted from the light emitting unit 130 upward. The reflection member 120 may be formed in a film shape and may be formed by including a synthetic resin which spread-contains white pigment so as to implement the natures helping promote the reflection and diffusion of light. For example, the white pigment may be titanium dioxide, aluminum oxide, zinc oxide, carbonate, barium sulfate, calcium carbonate, etc, and the synthetic resin may be polyethylene terephthalate, polyethylene, naphthalate, acryl resin, polycarbonate, polystyrene, polyolefin, cellulose acetate, weatherproof vinyl, etc., but such material is not limited to them.

A reflection pattern 121 may be formed on the surface of the reflection member 120. The reflection pattern 221 serves to scatter and disperse incident light to make sure that the light is uniformly transmitted into the upper portion. The reflection pattern 121 can be formed by printing on the surface of the reflection member 120 using a reflection ink which contains one among $TiO_2$, $CaCO_3$, $BaSO_4$, $Al_2O_3$, Silicon, PS, etc., and such method is not limited thereto.

In particular, when the reflection pattern 121 is implemented in a printing structure using the reflection ink, in consideration of a portion where a high reflectivity is required and a portion where a low reflectivity is required depending on the arrangement of the light source, a design of the optical pattern can be easily performed. Moreover, in a case where the reflection ink containing the aforesaid metal material is applied to the reflection pattern 121, it is advantageous that the reflection pattern 121 shows an excellent reflection efficiency compared to that of a general reflection pattern which is implemented in a protruding structure with regard to a structural aspect.

The reflection pattern is formed in a structure formed of a plurality of protruding patterns. So as to enhance the reflection and diffusion effects of light, it can be formed in a dot pattern shape, a prism shape, a lenticular shape, a concave lens shape, a convex lens shape or a combination of at least two shapes, but it is not limited to them. In addition, a cross section of the reflection pattern may be formed in various shapes such as a triangle shape, a quadrangle shape, a semi-circular shape, a sine wave shape, etc.

The optical member 210 may be disposed on an upper surface of the reflection member 120, and may have a structure in which the optical pattern is formed on a surface being toward the reflection member 120. In a case where the resin layer is formed on the reflection member 120, and the protruding patterns of the optical pattern move upward, it is problematic that a pattern function may be lost because the resin enters gaps between the prism patterns.

Also, in a case where the optical pattern is formed on the surface which comes into contact with the reflection member, the light reflected at the reflection member may be immediately scattered by the optical pattern so that an advantageous effect can be implemented in light of the efficiency for light utilization.

The optical pattern of the optical member 210 may be formed on a surface opposite to a surface which comes into contact with the resin layer 150.

At this time, the optical member 210 may be formed of any one of a prism sheet having a plurality of unit prism lens patterns, a micro lens array sheet and a lenticular lens sheet, or a combination formed of at least two of them. A difference in lens patterns of the optical member has its meaning in light of the matter that a light emitting path of a three-dimensional structure according to the present embodiment of the invention can be variously designed thanks to the difference.

As shown in the drawings, with the aid of the optical pattern, a gap 230 is formed between the optical member 210 and the reflection member 120, and an adhering pattern 220 is formed in a shape corresponding to the optical pattern for the purpose of adhering the optical member 210 and the reflection member 120. According to the present embodiment, the adhering pattern 220 is formed on the reflection member 120. The gap 230 working as an air layer is not formed at the portion where the adhering pattern 220 is formed. In particular, in a case where the adhering pattern 220 is adhered over the whole surface using a double-sided adhesive without the air layer, the appearance can be contaminated, and a 3D effect can be reduced because the air layer does not exist. Also, the portion where the adhering pattern exists has an excellent adhesion effect and a difference in reflective index compared to the portion of the air layer, which is formed at the portion where the adhering pattern does not exist. Thus, it is advantageous that various design effects in forming three-dimensional light can be implemented.

As such, since the lighting device comprises the optical member 210 such as a prism sheet, etc. where the optical pattern is formed, not a simple plane surface light emission, a geometric optical pattern can be formed, and the shape and 3D feeling of the light can change depending on the viewing angle.

At this time, the intensity of light can be adjusted by forming a pattern on the reflection member 120 using a reflection ink. The shape of the protruding optical pattern can be changed using the adhering pattern 220 formed between the reflection member 120 and the optical member 210.

Figure 2:
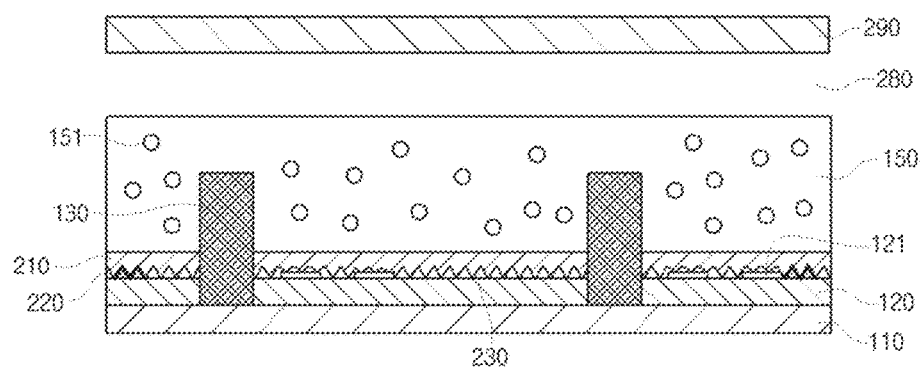
FIG. 2 is a view illustrating a structure in which a bead and an optical member are added to the lighting device according to the embodiment of the present invention illustrated in FIG. 1.

FIG. 2 is a view illustrating a structure 100b in which beads and an optical member are added to the lighting device according to the embodiment illustrated in FIG. 1.

Referring to FIGS. 1 and 2, a plurality of light diffusers 151 each having pores (or gaps) may be further contained in the interior of the resin layer 150 according to the present embodiment of the invention in a mixed form or a diffused form. The light diffusers 151 server to enhance the reflection and diffusion of light. For example, when light outputted from the light emitting unit 130 is inputted into the light diffusers 151 in the interior of the resin layer 150, the light is reflected by the pores of the light diffusers 151 and transmits and focuses, so the light emits in the upward direction of the resin layer. The light diffusers 151 may be implemented of a bead structure as one example.

When a lighting device 100b according to another embodiment of the present invention as illustrated in FIG. 2 may further include a second optical member 290 in an upper portion of the resin layer 150.

In a case where the second optical member 290 as the structure illustrated in FIG. 2 is formed in the lighting device according to the present embodiment, the light diffused and focused at the resin layer emits to the second optical member 290. At this time, the reflectivity and diffusion rate of the light increase thanks to the light diffusers 151, so the light intensity and uniformity of the emitting light supplied to the second optical member 290 are enhanced, and consequently the luminance of the lighting device can be enhanced.

The second optical member 290 may include a means, which performs an optical operation, for example, a light guide, a lens, an optical diffusion layer and the like. In FIG. 2, the second optical member 290 according to the present embodiment is illustrated as an optical diffusion layer, but it is not limited to this.

Also, the contents of the light diffusers 151 can be properly adjusted so as to obtain a targeted light diffusion effect. In more details, it can be adjusted within a scope of 0.01~0.3 weight % as compared to the whole resin layer 150, but it is not limited to this. The light emitting in the lateral direction from the light emitting unit 130 can be diffused and reflected by way of the resin layer 150 and the light diffusers 151 and can travel upward. The light diffusers 151 may be made from one among silicon, silica, glass bubble, PMMA, urethane, Zn, Zr, $Al_2O_3$, and acryl. The diameter of each light diffuser 151 may be in a scope of 1 μm to 20 μm, but it is not limited to this.

The lighting device 100b according to the present embodiment of the invention may be implemented in a structure by further comprising the second optical member 290. In this case, the second optical member 290 is formed on the upper portion of the resin layer 150 while ensuring that the light outputted via the resin layer 15 can concentrated. The second optical 290 is generally made from an acryl resin, but it is not limited thereto. All kinds of materials can be used as long as such materials have light collection functions like high transmission plastic such as polystyrene (PS), poly methyl metacrylate (PMMA), circular olefin copoly (COC), poly ethylene terephthalate (PET), resin, etc.

As not shown in the drawings, the reflection pattern may be formed at a lower portion of the second optical member 290. Here, the reflection pattern represents that protruding patterns are uniformly or non-uniformly arranged to make sure that the externally emitting light can have geometric patterns by reflecting and diffusing the inputting light. The above mentioned reflection pattern is formed in a structure formed of a plurality of patterns. So as to enhance the reflection and diffusion effects of light, it can be formed in a prism shape, a lenticular shape, a concave lens shape, a convex lens shape or a combination of at least two shapes, but it is not limited to them. In addition, the cross section of the reflection pattern may be formed in various shapes such as a triangle shape, a quadrangle shape, a semi-circular shape, a sine wave shape, etc. It can be configured in a structure which could change the size or density of each pattern depending on a distance from the light emitting unit 130.

The reflection pattern according to the present embodiment may be formed by directly processing the second optical member 290, but it is not limited thereto. All kinds of possible methods that have been developed or are under developments or will be developed in the future can be used including a method that a film having regular patterns is attached to the second optical member 290.

A first spacing part 280 may be formed between the second optical member 290 and the resin layer 150. At this time, thanks to the presence of the first spacing part 280, the uniformity of light supplied from the second optical member 290 can be enhanced. Consequently, the present invention can have an effect that the uniformity of light diffused and outputted via the second optical member 290 can be enhanced and an effect that the uniform plane surface light emission can be obtained. In an attempt to minimize the deviations of light which has passed through the resin layer 150, a thickness H1 of the first spacing part 280 may be formed in a range of 0 to 20 mm. When the thickness of the first spacing part is 0, the spacing part does not exist, and when the thickness exceeds 20 mm, the intensity of light reduces, and it is problematic that reliability as a lighting device cannot be secured.

FIG. 3 is a view illustrating a structure 100c in which the second optical member and an optical sheet are added to the lighting device according to the embodiment illustrated in FIG. 1.

Referring to FIGS. 1 to 3, a lighting device 100c according to still another embodiment of the present invention may further comprise: a first optical sheet 170 that is formed between the resin layer 150 and the second optical member 290 and is formed on the upper surface of the resin layer 150; a second optical sheet 190 formed on the first optical sheet 170; and an adhering layer 180 disposed between the first optical sheet 170 and the second optical sheet 190. A second spacing part 181 may be further formed at the adhering layer 180. In other words, the adhering layer 180 forms a space (second spacing part 181) around an optical pattern 183, and an adhering substance is coated on the other portions, so the first optical sheet 170 and the second optical sheet 190 are adhered to each other.

In addition, the optical pattern 183 may be further formed on an upper surface of the first optical sheet 170 or a lower surface of the second optical sheet 190, and at least one optical sheet may be further formed on the second optical sheet 190. The structure formed of the first optical sheet 170, the second optical sheet 190, the adhering sheet 180 and the optical pattern 183 can be defined as an optical pattern layer A. In a case where the second optical sheet 190 and the first optical sheet 170 form a double layer structure by providing the second optical sheet 190, an air layer is formed around the optical pattern, and thus light passing through the resin is again scattered due to an air layer having a different refractive index, thereby improving a light diffusion property. In a case where the adhering layer serves as a spacer, which forms the air layer while being formed in a structure which surrounds the peripheral portion of the optical pattern, a light shielding effect can be realized by the optical pattern and a light diffusion effect can be implemented at the peripheral portion. Also, when there is no air layer, the light shielding effect is remarkably reduced.

Also, the optical pattern 183 formed on the upper surface of the first optical sheet 170 or the lower surface of the second optical sheet 190 may be formed of a light shielding pattern so as to prevent the light from the light emitting unit 160 from focusing. For this, it is needed to align between the optical pattern 183 and the light emitting unit 130. The first optical sheet 170 and the second optical sheet 190 are adhered using the adhering layer 180 so as to obtain a stable fixing force after the aligning procedure.

The first optical sheet 170 and the second optical sheet 190 may be made from materials having high light transmissivity, for example, they can be made from PET as one example.

The optical pattern 183 disposed between the first optical sheet 170 and the second optical sheet 190 serve to prevent the light from the light emitting unit 130 from not focusing. The light shielding pattern may be provided to produce a partial light shielding effect so as to prevent the optical characteristics from worsening owing to too high intensity of light or the yellow light from becoming yellowish. The above mentioned light shielding pattern can be formed by means of a printing process on the upper surface of the first optical sheet 170 or the lower surface of the second optical sheet 190 using a light shielding ink.

The optical pattern 183 may be configured to adjust the light shielding degree or diffusion degree using one optical pattern so that the light can be fully shielded or part of the light can be shielded along with the light diffusion function. More specifically, the optical pattern 183 of the present invention may be implemented in a double printing structure of a combined pattern. Here, the structure of a double printing structure represents a structure formed as one pattern is formed, and then another pattern is formed on the same.

According to the present embodiment of the invention, the optical pattern 183 may be in the double structure of a diffusion pattern formed on a lower surface of a polymer film (for example, second optical sheet) in the emitting direction of light using a light shielding ink containing at least one among $TiO_2$, $CaCO_3$, $BaSO_4$, $Al_2O_3$, silicon, etc. and a light shielding pattern formed using a light shielding ink containing Al or a mixture of Al and $TiO_2$. The double structure of the optical pattern s intended to efficiently control a hot spot phenomenon generated due to the light emitted from the light source such as LED. Thanks to the structure, a more stable light shielding effect compared to the light shielding pattern formed in a printing structure of FIG. 1 can be implemented. Also, since the thickness which can be implemented by a printing process is limited, by implementing different pattern shapes from each other using a plurality of printing processes, the pattern shapes are adjusted depending on a distance from the LED to generate a partial difference in thickness among the patterns, so that the light shielding efficiency can be improved.

That is, after a diffusion pattern is white-printed on the surface of the polymer film, a light shielding pattern may be formed on it, and on the contrary, the double structure may be formed in the sequence opposite to it. When the double printing structure corresponds to the structure in which after the diffusion pattern is white-printed on the surface of the polymer film, the light shielding pattern is formed on it, or the structure opposite to the structure, thanks to existence of the light diffusion pattern, penetrating light is not completely shielded and light filtered by the light shielding pattern can be diffused upward, thereby increasing efficiency for light utilization.

It is obvious that the formed design of such patterns may change in various forms depending on the efficiency, intensity and light shielding ratios of light. Alternatively, there may be provided a triple structure in which a light shielding pattern formed of a metallic pattern formed at the center of the sequential stacking structure and the diffusion pattern is formed at the upper side and the lower side, respectively. The above mentioned triple structure could be implemented by selecting one of the above mentioned materials. Preferably, one of the diffusion patterns may be formed using $TiO_2$ having a good refractive index. Another diffusion pattern may be formed using $CaCO_3$ having a good optical stability and a good-looking color along with $TiO_2$. The efficiency and uniformity of light can be obtained with the aid of the triple structure which implements the light shielding patterns using Al which has a good hiding function. In particular, $CaCO_3$ has a function of providing white light with the aid of a function of reducing the exposure of yellow light, thus obtaining more stable illuminating effects. An inorganic material having a larger particle size and a similar structure such as $BaSO_4$, $Al_2O_3$, silicon bead, etc. except for $CaCO_3$ could be applied. In addition, it is preferred that the optical pattern 183 is formed to have a good illuminating efficiency by adjusting the pattern density so that the pattern density gets lower as it becomes farther from the emitting direction of the LED light source.

The adhering layer 180 may be formed in a structure that the peripheral portion of the optical pattern 183 is surrounded, and a second spacing part 181 is formed at the other portions or in a structure that a second spacing part 181 is formed around the optical pattern 183. So, an alignment can be obtained by adhering two optical sheets. In other words, the adhering structure of the first optical sheet 170 and the second optical sheet 190 serves to fix the printed optical patterns 183.

At this time, the adhering layer 180 may be made from a thermosetting PSA, a thermosetting adhesive or a UV curable PSA type substance, but it is not limited to them.

Figure 4:
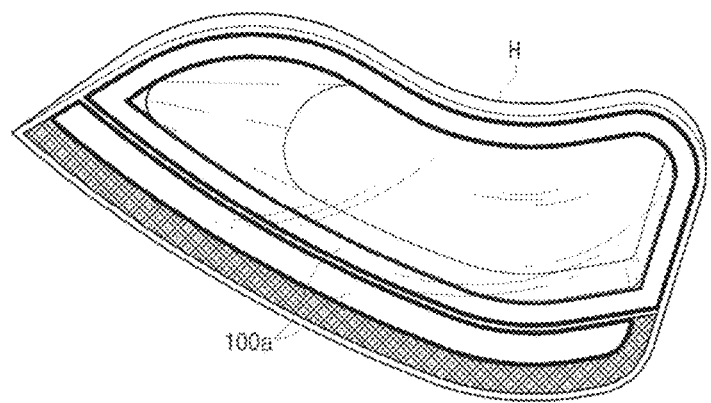
FIG. 4 is a schematic view illustrating a structure in which the lighting device according to the embodiment of the present invention is applied to a headlight for a vehicle.

As shown in FIG. 3, the first spacing part 280 may be formed between the second optical sheet 190 and the second optical member 290. Tanks to the presence of the first spacing part 280, the uniformity of the light supplied to the second optical member 290 can be enhanced, and consequently, the uniformity of the light diffused and emitted by way of the second optical member 290 can be enhanced. At this time, the thickness H1 of the first spacing part 280 may be formed in a range of 0 to 20 mm in order to minimize the deviations of the light which passes through the resin layer 150, but it is not limited thereto. If necessary, it can be changed properly depending on the necessities as shown in FIG. 4. Thanks to the existence of the first spacing part, light passing through the optical member 150 and the optical pattern layer penetrates mediums having different refractive indexes while passing through the air layer of the spacing part once again so that a light diffusion property or a light scattering property can be improved, and then the light again penetrates the mediums having the different refractive indexes through the second optical member so that the uniformity of the diffused and scattered light can be improved.

The second optical member 290 is formed in a fragment to be disposed only at the upper portion of the LED so that the LED can be covered from the outside. As a result, the appearance of the light device can get better during lighting or black out, and the surface light emission can be performed. A surface light emission effect is generated at a portion where the LED does not exist.

As not shown in the drawings, at least one optical sheet can be further formed on the optical pattern layer "A" if needed.

FIG. 4 is a schematic view illustrating a structure in which a lighting device according to the one embodiment of the present invention is applied to a headlight for a vehicle.

As shown in FIG. 4, the lighting device 100*a* according to the one embodiment of present invention is formed using a flexible circuit board and a resin layer, so the lighting device itself has flexibility. As shown in FIG. 6, thanks to such flexibility, the present invention can be easily applied to the headlight housing 300 for a vehicle with curved surfaces. The degree of design freedom for the sake of a finished product engaged with the housing can be enhanced. Separate from the effect and design freedom, uniform brightness and luminance can be obtained. FIG. 4 shows that the lighting device illustrated in FIG. 1 is engaged, but it is provided only for an illustrative purpose, and the lighting device illustrated FIG. 2 or 3 may be engaged.

Figure 5:
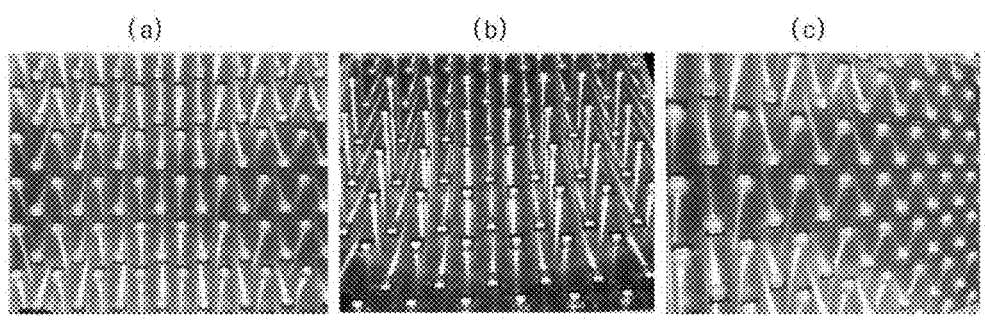
FIG. 5 is a view illustrating an actual operation state image of the lighting device according to the embodiment of the present invention.

FIG. 5 is a view illustrating an actual operation state image at the front view, bottom view and lateral view of the lighting device according to the one embodiment of the present invention. As shown in FIG. 5, thanks to the protruding optical patterns, the shapes of light can visually change depending on the viewing angle when viewing the light source.

As the present invention may be embodied in several forms without departing from the spirit or essential characteristics thereof, it should also be understood that the above-described examples are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A lighting device, comprising:
   a printed circuit board;
   an optical member on the printed circuit board and comprising a protrusion optical pattern;
   at least one light emitting unit on the printed circuit board; and
   a resin layer on the printed circuit board,
   wherein the resin layer comprises a plurality of light diffusers, and
   wherein the optical member comprises any one of a prism sheet having a plurality of unit prism lens patterns, a micro lens array sheet, and a lenticular lens sheet, or any combination thereof.

2. The lighting device of claim 1, wherein the optical member comprises a first surface contacting the resin layer and a second surface opposite to the first surface, wherein the protrusion optical pattern is disposed on the second surface of the optical member.

3. The lighting device of claim 1, further comprising a second optical member disposed in an upper portion of the resin layer.

4. The lighting device of claim 1, wherein the plurality of light diffusers is selected from the group consisting of silicon, silica, glass bubble, PMMA, urethane, Zn, Zr, Al2O3, and acryl.

5. The lighting device of claim 1, wherein the light emitting unit is formed of a side view type light emitting diode.

6. The lighting device of claim 1, further comprising a reflection member provided between the optical member and the printed circuit board, wherein the reflection member comprises a gap formed between the optical member and the reflection member.

7. The lighting device of claim 6, wherein the reflection member comprises an adhering pattern formed in a shape corresponding to the optical pattern for the purpose of adhering the optical member and the reflection member.

8. The lighting device of claim 7, wherein the optical pattern of the optical member is provided on a surface that comes into contact with the reflection member.

9. The lighting device of claim 8, further comprising a reflection pattern formed on the reflection member.

10. The lighting device of claim 3, wherein a first spacing part is formed between the resin layer and the second optical member.

11. The lighting device of claim 10, wherein the resin layer and the second optical member are spaced apart from each other at a distance that is greater than zero and up to 20 mm.

12. The lighting device of claim 11, further comprising a first optical sheet formed on an upper surface of the resin layer.

13. The lighting device of claim 12, further comprising a second optical sheet formed on the first optical sheet.

14. The lighting device of claim 13, further comprising an adhering layer formed between the first optical sheet and the second optical sheet disposed to be opposite to the first optical sheet.

15. The lighting device of claim 14, further comprising an optical pattern formed on either an upper surface of the first optical sheet or a lower surface of the second optical sheet, the optical pattern shielding or reflecting an emitting light.

16. The lighting device of claim 15, wherein the optical pattern is formed in a double structure in which a diffusion pattern containing at least one selected from the group consisting of TiO2, CaCO3, BaSO4, and silicon and a light shielding pattern containing Al or a mixture of Al and TiO2 form the double structure.

17. The lighting device of claim 1, wherein the resin layer is formed of an ultraviolet ray thermosetting resin containing oligomer, and wherein the oligomer contains any one material selected from the group consisting of urethane acrylate, epoxy acrylate, polyester acrylate, and acrylic acrylate.

18. A lighting device, comprising:
   a printed circuit board;
   an optical member on the printed circuit board and comprising a protrusion optical pattern;
   at least one light emitting unit on the printed circuit board; and
   a resin layer on the printed circuit board,
   wherein the resin layer comprises a plurality of light diffusers,
   wherein the resin layer is formed of an ultraviolet ray thermosetting resin containing oligomer, and wherein the oligomer contains any one material selected from the group consisting of urethane acrylate, epoxy acrylate, polyester acrylate, and acrylic acrylate.

* * * * *